United States Patent [19]

Plies

[11] Patent Number: 4,788,495
[45] Date of Patent: Nov. 29, 1988

[54] METHOD FOR THE INDIRECT IDENTIFICATION OF THE INTENSITY DISTRIBUTION OF PARTICLE BEAM PULSES GENERATED IN A PARTICLE BEAM MEASURING INSTRUMENT

[75] Inventor: Erich Plies, Munich, Fed. Rep. of Germany

[73] Assignee: Siemens Aktiengesellschaft, Berlin and Munich, Fed. Rep. of Germany

[21] Appl. No.: 845,517

[22] Filed: Mar. 28, 1986

[30] Foreign Application Priority Data

Mar. 28, 1985 [DE] Fed. Rep. of Germany ....... 3511372

[51] Int. Cl.$^4$ ...................... G01R 13/02; G01N 23/00
[52] U.S. Cl. ........................... 324/158 R; 324/158 D; 324/73 R; 250/310; 250/311
[58] Field of Search ................. 324/158 R, 158 D, 71; 250/310, 311; 356/318, 301, 400; 364/728

[56] References Cited

U.S. PATENT DOCUMENTS

| | | | |
|---|---|---|---|
| 4,037,101 | 7/1977 | Okumura et al. | 250/310 X |
| 4,220,854 | 9/1980 | Feuerbaum | 324/158 R X |
| 4,407,008 | 9/1983 | Schmidt et al. | 356/318 |
| 4,413,181 | 11/1983 | Feuerbaum | 250/310 X |
| 4,486,660 | 12/1984 | Feuerbaum | 250/310 X |

FOREIGN PATENT DOCUMENTS 0024585 2/1977 Japan ............................ 324/158 D X
0218738 12/1983 Japan ............................ 324/158 D X

OTHER PUBLICATIONS

Brigham: "The Fast Fourier Transform (FFT)", Prentice Hall (1974), Chapter 10, pp. 148–169.
Scanning Electron Microscopy (1979), "VLSI Testing Using the Electron Probe", by H. P. Feuerbaum, pp. 285–296.
Dissertation—E. Menzel—Universital—Gesemthuchschule, Duisburg (1981), pp. 89–95.
"Scanning", vol. 5 (1983), pp. 14–24—Electron Beam Testing: Methods and Applications, by H. P. Feuerbaum.

Primary Examiner—Reinhard J. Eisenzopf
Assistant Examiner—Vinh P. Nguyen

[57] ABSTRACT

For indirect identification of an intensity distribution of particle beam pulses generated in a particle beam measuring instrument by use of a beam blanking system, a signal s(t) known in terms of its time-dependency is periodically fed into a specimen and stroboscopically sampled according to the sampling principle. The desired intensity distribution of the particle beam pulses is subsequently calculated by de-convolution of the measured signal h(t) recorded by the measuring chain.

3 Claims, 2 Drawing Sheets

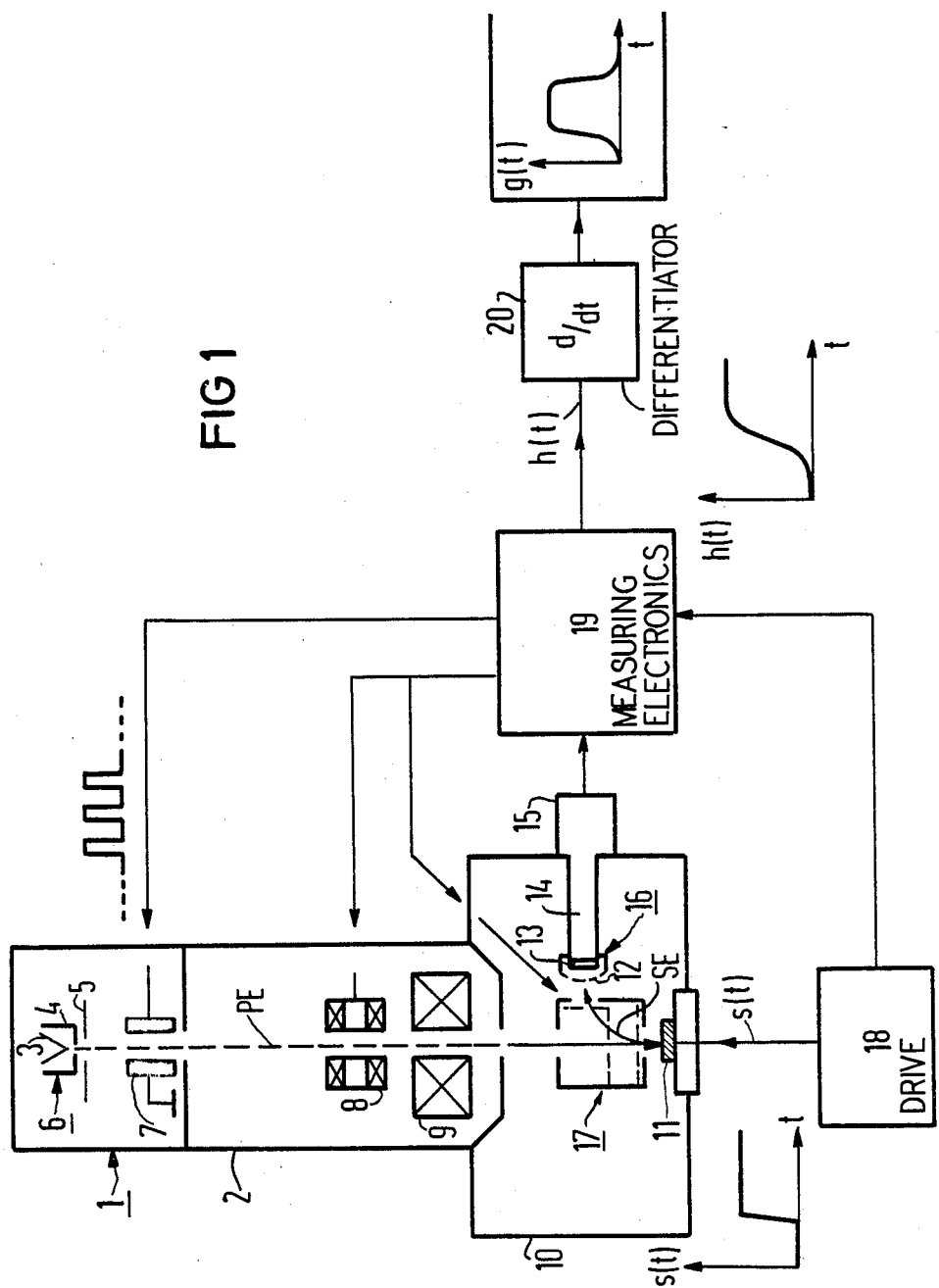

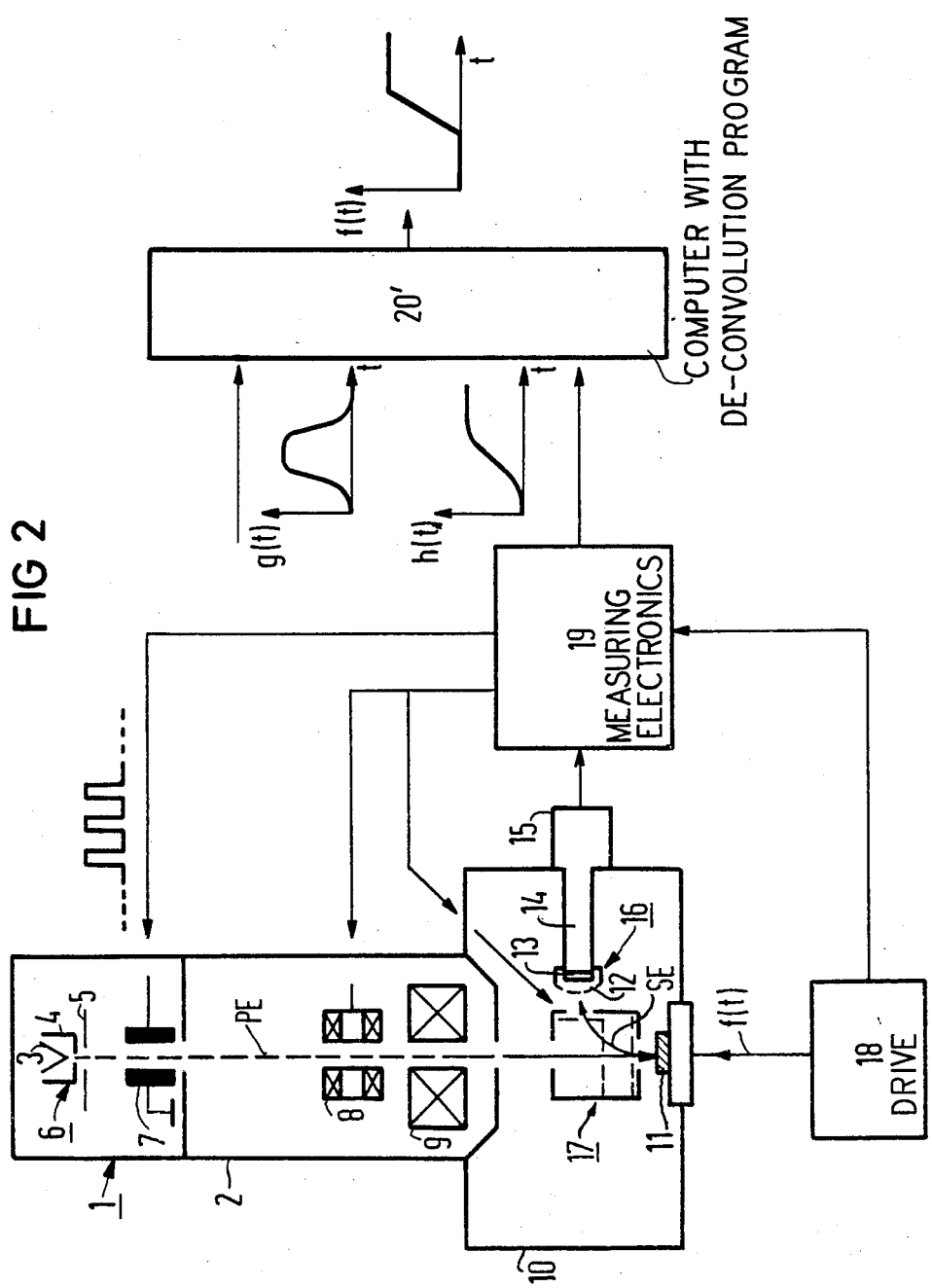

METHOD FOR THE INDIRECT IDENTIFICATION OF THE INTENSITY DISTRIBUTION OF PARTICLE BEAM PULSES GENERATED IN A PARTICLE BEAM MEASURING INSTRUMENT

BACKGROUND OF THE INVENTION

The invention relates to a method for the identification of the intensity distribution of particle beam pulses generated in a particle beam measuring instrument having a beam blanking system.

The functioning of integrated circuits is usually automatically monitored with computer-controlled test installations. In most cases, however, the tests executed in such fashion are incomplete since perceived faults can only be localized with great difficulty. Particularly during the development phase, additional measurements in the inside of the integrated circuits must therefore be carried out. Electron beam measuring instruments operating in non-contacting and non-destructive fashion are particularly suitable for these purposes, these being increasingly employed in all areas of development and fabrication of micro-electronic components. The electron beam measuring methods most frequently employed in practice are described, for example, in the periodical "Scanning", Vol. 5, (1983) in the survey articles by H. P. Feuerbaum or Menzel and Kubalek on pages 14 through 24 and 103 through 122, both incorporated herein by reference. Particularly illuminating references regarding the localization of faults in LSI circuits are obtained by means of quantitative measurements of the chronological curve of potential at selected nodes of the components to be tested. The primary electron beam generated in the electron-optical column of a modified scanning electron microscope is thereby positioned, for example, to a measuring point. The dislocation of the energy distribution of the secondary electrons triggered at the measuring point which is dependent on the potential of the component is determined in a spectrometer. Quantitative measurements of the curve of potential having a chronological resolution in the nano second range are only possible stroboscopically based on the sampling principle. Given this method from electrical measuring technology, the primary electron beam is pulsed synchronously with the frequency of the signal to be measured and the curve of potential is continuously scanned or sampled by displacing the cut-in time of the primary electron pulses. Undisturbed measurements of the chronological curve of potential can only be implemented when the shape of a technologically unrealizable dirac pulse can be assumed for the primary electron pulse.

Since the beginning of the employment of stroboscopy or the sampling method for measuring the chronological curve of potential in micro-electronic components, the exact identification of the electron pulse duration was an extreme problem. It was thus attempted to derive the pulse duration given a known pulse repetition rate from the reduction of the mean beam current given a pulsed mode of the electron beam measuring instrument in comparison to the beam current given continuous operation. This method, however, only supplies extremely rough estimated values since assumptions regarding the intensity distribution of the primary electron pulses which are not experimentally testable enter into the calculations.

A method for the direct measurement of the primary electron pulse durations in an electron beam measuring instrument is set forth in the dissertation of E. Menzel "Elektronenstrahltestsystem fuer die Funktionskontrolle und Fehleranalyse Hoechstintegrierter Schaltkreise", Universitaet-Gesamthochschule-Duisburg (1981), incorporated herein by reference. The basis of this known method is the transformation of the chronological intensity distribution of the primary electron pulses into a topical distribution which is then sensed or sampled with a topically resolving documentation system. An arrangement for the implementation of this method is essentially formed of a beam blanking system additionally situated in the specimen chamber of an electron beam measuring instrument, said beam blanking system having a separate deflection capacitor, a fine needle point, and an involved control and signal processing electronics. The primary electron pulses generated with the blanking system traverse the linearly rising field of the deflection capacitor, whereby the electrons forming the pulse are deflected to differing degrees in the field of the deflection capacitor in accordance with their chronological arrival. With the assistance of the fine needle point, then, a narrow region of the topical intensity distribution generated in such fashion from the chronological intensity distribution of the primary electron pulse is blanked out, since only primary electrons impinging in the region of the needle tip contribute to the secondary electron signal. The registration of the intensity distribution then occurs by variation of the delay time between the voltage adjacent to the beam blanking system and the voltage of the deflection capacitor.

This known method for direct measurement of the intensity distribution of a primary electron pulse requires a relatively great expense for apparatus and is therefore hardly suited for employment in one of the modified scanning electron microscopes which are predominantly utilized in the framework of electron beam measuring technology.

SUMMARY OF THE INVENTION

It is therefore an object of the invention to specify a method of the type initially cited with which the intensity distribution of the particle beam pulses or electron beam pulses generated in a particle beam measuring instrument, particularly in an electron beam measuring instrument, can be indirectly identified.

This is achieved in accordance with the invention by directing a pulsed primary particle beam at a measuring point of the specimen. A signal s(t) is periodically applied to said measuring point, the signal being known in terms of its time-dependency. A chronological curve of potential of the known signal s(t) is stroboscopically sensed according to a sampling principle by shifting a cut-in time of the primary particle beam pulses. Secondary particles triggered at the measuring point by the primary particles are documented by use of a detector system which outputs a secondary particle signal. A measured signal h(t) also known in terms of its time-dependency is derived from the secondary particle signal dependent on the signal s(t) at the measuring point. The intensity distribution g(t) of the primary particle beam pulses is acquired by deconvolution of the measuring signal h(t).

An advantage obtainable with the method of the invention is that the intensity distribution of a particle beam pulse can be acquired with only an insignificant expansion of the measuring chain of the particle beam measuring instrument generating the pulses.

BRIEF DESCRIPTION OF THE DRAWINGS

FIG. 1 is an illustration of the intensity distribution identification system of the invention employed with a particle beam pulse generator in a particle beam measuring instrument; and FIG. 2 is an illustration of a system similar to claim 1 but wherein improved chronological resolution is obtained.

DESCRIPTION OF THE PREFERRED EMBODIMENTS

In accordance with the exemplary embodiment of an arrangement for the implementation of the method of the invention shown in FIG. 1, a finely focussed particle beam, for example an electron beam PE, is generated in the electron-optical column 2 of an electron beam measuring instrument 1. In addition to a plurality of magnetic lenses and diaphragms for beam shaping which are not shown here, this column 2 comprises an electron gun 6 essentially formed of cathode 3, Wehnelt electrode 4, an anode 5, a beam blanking system 7, a deflection system 8, and a lens system 9 for focussing the electron beam. By means of an appropriate drive of the electromagnets of the deflection system 8, the primary electron beam t is positioned onto the specimen 11 situated in a specimen chamber 10. Electrostatic deflection systems can also be utilized instead of magnetic deflection systems. A detector system 16 constructed, for example, of shielding grating 12, scintillator 13, optical fiber 14, and photomultiplier 15 serves for the documentation of the secondary electrons SE triggered by the primary electron beam PE. This detector system 16 is preceded by a spectrometer 17, preferably an opposing field spectrometer, with which the shift of the energy distribution of the secondary electrons which is dependent on the specimen potential can be measured relative to a reference value. High-frequency test signals s(t) which are periodically fed into the specimen 11 with the drive 18 lead to a secondary electron signal at the output of the detector system 16, which fluctuates with the frequency of the test signal, this secondary electron signal, finally, being further processed into the measured signal h(t) in the measuring electronics 19. In addition, the measuring electronics 19 controls and monitors, among other things, the beam blanking system 7 and the deflection system 8, synchronizes the sampling frequency of the primary electron pulses with the frequency of the signal s(t) at the component, and holds the voltage difference between the opposing field electrode of the spectrometer and the measuring point potential constant. The structure and functioning of the measuring electronics 19 can be derived, for example, from the article by H. P. Feuerbaum "VLSI Testing Using the Electron Probe" in the periodical "Scanning Electron Microscopy" (1979), pages 285 through 296, incorporated herein by reference. The measuring electronics is also known from prior art U.S. Pat. Nos. 4,413,181 and 4,486,660. Since only the measured signal h(t) supplied by the measuring electronics 19 is of interest for the method of the invention, the specific embodiment of this arrangement need not be set forth in greater detail below.

Potentials s(t) changing very rapidly in time can be quantitatively measured with the electron beam measuring instrument 1 shown in FIG. 1 with the sampling method known from electrical measurement technology. The primary electron beam PE is positioned to a point of the specimen 11 and the beam blanking system 7 is driven by the measuring electronics 19 such that the primary electron beam PE is gated and blanked synchronously with the repetition frequency of the specimen sinnal s(t). The primary electron beam PE is thus always gated precisely when the measuring point potential s(t) assumes a specific value. Only when the measuring signal s(t) is unequivocally perceived in the background noise is the phase relation of the primary electron pulses PE shifted relative to the specimen potential s(t) in order to record a new measured value. Controlled by the measuring electronics 19, the chronological curve of potential s(t) at a measuring point of the specimen 11 can be sampled by a continuous shift of the cut-in time of the primary electron pulses and can be displayed on, for example, the picture screen of a cathode ray tube which is not shown in FIG. 1.

The quantitative measurement of the chronological curve of potential according to the sampling method can be mathematically described as a convolution. When s(t) indicates the voltage signal fed into the specimen 11 by the specimen drive 18, g(t) indicates the primary electron pulse, and h(t) indicates the output signal supplied by the measuring chain formed of spectrometer 17, detector system 16, and measuring electronics 19. These quantities are linked to one another in accordance with equation (1):

$$h(t) = s(t) * g(t) := \int_{-\infty}^{+\infty} s(\tau)g(t - \tau)d\tau. \tag{1}$$

For indirect identification of the intensity distribution of the electron pulses generated with the beam blanking system 7 of the electron beam measuring instrument 1 shown in FIG. 1, a norm signal s(t) known in terms of its time behavior is periodically fed into the specimen 11 with the drive 18, and the signal s(t) is sampled in accordance with the above-described sampling method. The time-dependency of this norm signal s(t) was previously measured in, for example, a commercially available sampling oscilloscope having high chronological resolution. Step-shaped voltage pulses having steep rising edges and a short rise time in comparison to the primary electron pulse duration are particularly advantageous as norm sig nal s(t). In the ideal case of a step function heaviside function) with $\sigma(t)=0$ for times t less than 0 and $\sigma(t)=1$ for times t greater than 0, the recorded measured signal h(t) would then correspond to the step response to the measuring chain formed by spectrometer 17, detector system 16, and measuring electronics 19. When an ideal step function $\sigma(t)$ is assumed for the norm signal s(t) fed into the specimen, then the measured signal h(t) acquired according to the sampling principle and the primary electron pulse g(t) are linked to one another in accordance with equation (2).

$$h(t) = s(t) * g(t) = \int_0^t g(\tau)d\tau \tag{2}$$

The statement which is immediately equivalent to equation (2) derives therefrom:

$$g(t) = \frac{d}{dt} h(t) \qquad (3)$$

This means that the intensity distribution of the primary electron pulse g(t) can be acquired by simple differentiation of the measured signal h(t) recorded by the measuring arrangement in accordance with the sampling principle when the primary electron pulse duration is great in comparison to the edge rise time of the step signal s(t) periodically fed into the specimen 11.

The execution of this mathematical operation occurs with the assistance of the differentiator 20 shown in FIG. 1 at whose output the indirectly identified intensity distribution of the primary electron pulses is taken and can be output on an output unit not shown in FIG. 1.

The method of the invention, of course, is not limited to the employment of a step signal as a norm signal s(t), but rather can be fundamentally executed with any arbitrary signal whose chronological curve is known. However, the intensity distribution of the primary electron pulses g(t) then no longer derives simply by differentiating the measured signal h(t), but, on the contrary, must be numerically calculated by de-convolution according to equation (1). This problem is significantly simplified by applying the convolution theorem such that a convolution in the time range corresponds to a multiplication in the frequency range. In the frequency range, thus equation (1) assumes the following form:

$$H(\gamma) = G(\gamma) \cdot S(\gamma) \qquad (4)$$

Here, $H(\gamma)$ and $S(\gamma)$ indicates the Fourier transform of the known measuring or norm signal h(t) and s(t), and $G(\gamma)$ indicates the Fourier transform of the primary electron pulse g(t) desired.

By division of the known quantities $H(\gamma)$ and $S(\gamma)$ and subsequent inverse transformation of the function $G(\gamma)$ into the time range, the desired primary electron pulse g(t) is obtained. A calculation program for the execution of fast Fourier transformations according to the Cooley-Tukey algorithm is described, for example, in the textbook by Brigham, "The Fast Fourier Transform", Prentice Hall (1974), incorporated herein by reference.

The method of the invention can also be utilized in a simple way for improving the chronological resolution in quantitative measurements of the chronological curve of a particle beam measuring instrument operating according to the sampling principle. This shall be set forth below with reference to the electron beam measuring instrument shown in FIG. 2, whereby identical reference characters refer to identical arrangements as in FIG. 1.

An exact knowledge of the signal curve f(t) in, for example, LSI circuits is required in order to be able to recognize and eliminate weak points and design errors within the semiconductor components during the development phase by comparing measured and theoretically anticipated voltage values. Since the maximum possible chronological resolution depends on the pulse duration of the primary electron pulse g(t), the quality of the potential curve h(t) recorded according to the sampling method is essentially defined by the performance capability of the beam blanking system 7. When the frequency of the signal f(t) adjacent to the component then falls below a limit value dependent on the blanking system 7 employed, the primary electron pulse duration can no longer be neglected relative to the signal period, this directly leading to falsifications of the measured signal h(t) when compared to the actual signal f(t). In addition to the falsifications caused by the finite primary electron pulse duration, additional modifications which further deteriorate the chronological resolution also occur in the measuring chain constructed of spectrometer 17, detector system 16, and measuring electronics 19. According to equation (5)

$$h(t) = f(t) * g(t) := \int_{-\infty}^{+\infty} f(\tau)g(t-\tau)d\tau, \qquad (5)$$

which describes the general relationship between specimen signal f(t), primary electron pulse g(t), and measured signal h(t) in measurements of the chronological signal curve based on the sampling method, the desired undisturbed measuring signal f(t) can also be reconstructed by de-convolution from the signal h(t) falsely recorded by the measuring electronics 19 when the primary electron pulse g(t) is known. Before execution of the measurement of potential, however, this can be very precisely defined with the same measuring chain constructed of spectrometer 17, detector system 16, and measuring electronics 19 in accordance with the method of the invention, so that the falsifying influences of the measuring chain are also taken into consideration in the de-convolution in addition to the finite duration of the primary electron pulse. The de-convolution of the signal h(t) supplied by the measuring chain occurs, for example, numerically upon application of the convolution theorem, in accordance wherewith a convolution in the time range corresponds to a multiplication in the frequency range. Via the relationship $$F(\gamma) = H(\gamma)/G(\gamma), \qquad (6)$$

time-dependency of the specimen potential f(t) to be measured can be defined by an inverse Fourier transformation of the quantity $F(\gamma)$, being defined from the measured signal h(t) and the known primary electron pulse g(t) or the Fourier transforms $H(\gamma)$ and $G(\gamma)$ thereof. These calculations, which are rather involved numerically, are advantageously executed in a computer 20'. A FORTRAN program functioning according to the Cooley-Tukey algorithm for the implementation of fast Fourier transformation can, for example, be derived from the afore-mentioned textbook by Brigham.

Although various minor changes and modifications might be proposed by those skilled in the art, it will be understood that I wish to include within the claims of the patent warranted hereon all such changes and modifications as reasonably come within my contribution to the art.

I claim as my invention:

1. A method for identifying a time dependent intensity distribution g(t) of particle beam pulses generated in a particle measuring instrument employing a beam blanking system, comprising steps of:
   periodically applying a known signal s(t) known in terms of its time-dependency to a measuring point of a specimen;
   positioning a particle beam to the measuring point and creating the particle beam pulses by gating of the particle beam in synchronization with the known signal s(t);

documenting secondary particles triggered at the measuring point by said particle beam pulses in a detector system which outputs secondary particle signals;

stroboscopically sampling the known signal s(t) by shifting gating time points of the gated particle beam;

deriving a measured signal h(t) from the secondary particle signal produced by the detector system; and identifying the time-dependent intensity distribution g(t) of the particle beam pulses by de-convolution of said measured signal h(t).

2. A method according to claim 1 including the step of applying to the measuring point as said known signal s(t) a step signal having a short edge rise time compared to a width of the particle beam pulses applied to the measuring point, and acquiring by differentiation of the measured signal h(t) the time-dependent intensity distribution g(t) of the particle beam pulses.

3. A method for identifying a time-dependent signal curve f(t) applied to a measuring point of the specimen, comprising steps of:

positioning a pulsed particle beam to a measuring point having a known time-dependent intensity distribution g(t);

documenting secondary particles triggered at the measuring point by said particle beam pulses in a detector system which outputs a secondary particle signal;

stroboscopically sampling the signal f(t) by shifting gating time points of the gated particle beam;

deriving a measured signal h(t) from the secondary particle signal produced by the detector system; and identifying the signal curve f(t) by de-convolution of the measured signal h(t) through use of the known intensity distribution g(t).

* * * * *